US012027507B2

United States Patent
Murialdo et al.

(10) Patent No.: US 12,027,507 B2
(45) Date of Patent: Jul. 2, 2024

(54) 3D PRINTABLE FEEDSTOCK INKS FOR SIGNAL CONTROL OR COMPUTATION

(71) Applicant: Lawrence Livermore National Security, LLC, Livermore, CA (US)

(72) Inventors: Maxwell Murialdo, Westminster, CA (US); Yuliya Kanarska, Livermore, CA (US); Andrew J. Pascall, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 317 days.

(21) Appl. No.: 17/375,788

(22) Filed: Jul. 14, 2021

(65) Prior Publication Data

US 2021/0343685 A1 Nov. 4, 2021

Related U.S. Application Data

(62) Division of application No. 16/219,188, filed on Dec. 13, 2018, now Pat. No. 11,101,255.

(51) Int. Cl.
| | |
|---|---|
| *H01L 25/16* | (2023.01) |
| *H01L 25/00* | (2006.01) |
| *H01L 25/07* | (2006.01) |
| *H05K 1/16* | (2006.01) |
| *H05K 3/30* | (2006.01) |

(52) U.S. Cl.
CPC ............ *H01L 25/16* (2013.01); *H01L 25/07* (2013.01); *H01L 25/50* (2013.01); *H05K 1/16* (2013.01); *H05K 3/30* (2013.01)

(58) Field of Classification Search
CPC .......... H05K 1/16; C09D 11/52; H01L 24/70; H01L 24/67; H01L 24/95
See application file for complete search history.

(56) References Cited

U.S. PATENT DOCUMENTS

2016/0198576 A1 7/2016 Lewis et al.

OTHER PUBLICATIONS

Toffoli, T. and Margolus, N. Programmable matter: concepts and realization. Physica. D, Nonlinear phenomena, 47(1-2), 1991, pp. 263-272.
Shin, D.G., Kim, T.H. and Kim, D.E. Review of 4D printing materials and their properties. International Journal of Precision Engineering and Manufacturing-Green Technology, 4(3), 2017, pp. 349-357.
Kokkinis, D., Schaffner, M. and Studart, A.R. Multimaterial magnetically assisted 3D printing of composite materials. Nature communications, 6, 2015, p. 8643.

(Continued)

*Primary Examiner* — Khanh T Nguyen
(74) *Attorney, Agent, or Firm* — HARNESS DICKEY & PIERCE PLC

(57) ABSTRACT

In one aspect the present disclosure relates to a 3D printed signal control backbone apparatus. The apparatus may have a filament including a first material section and a plurality of second material sections. The first material section is bounded on opposing ends by the second material sections. The first material section is formed by an ink having a percolating network of a plurality of chiplets infused in a non-conductive polymer. The plurality of chiplets form electrically responsive elements imparting a predetermined logic function and which are responsive to a predetermined electrical signal. The second material sections are formed by an ink which is electrically conductive.

13 Claims, 11 Drawing Sheets

(56) References Cited

OTHER PUBLICATIONS

Momeni, F., Liu, X. and Ni, J. A review of 4D printing. Materials & design, 122, 2017, pp. 42-79.
Ge, Q., Dunn, C.K., Qi, H.J. and Dunn, M.L. Active origami by 4D printing. Smart Materials and Structures, 23(9), 2014, p. 094007.
van Manen, T., Janbaz, S. and Zadpoor, A.A. Programming 2D/3D shape-shifting with hobbyist 3D printers. Materials horizons, 4(6), 2017, pp. 1064-1069.
Tibbits, S. 4D printing: multi-material shape change. Architectural Design, 84(1), 2014, pp. 116-121.
Wu, A.S., Small IV, W., Bryson, T.M., Cheng, E., Metz, T.R., Schulze, S.E., Duoss, E.B. and Wilson, T.S. 3D printed silicones with shape memory. Scientific reports, 7(1), 2017, p. 4664.
Ding, Z., Yuan, C., Peng, X., Wang, T., Qi, H.J. and Dunn, M.L. Direct 4D printing via active composite materials. Science advances, 3(4), 2017, p. e1602890.
Ota, H., Emaminejad, S., Gao, Y., Zhao, A., Wu, E., Challa, S., Chen, K., Fahad, H.M., Jha, A.K., Kiriya, D. and Gao, W. Application of 3D printing for smart objects with embedded electronic sensors and systems. Advanced Materials Technologies, 1(1), 2016, p. 1600013.
Iyer, V., Chan, J. and Gollakota, S. 3D printing wireless connected objects. ACM Transactions on Graphics (TOG), 36(6), 2017, p. 242.
Rodriguez, J.N., Zhu, C., Duoss, E.B., Wilson, T.S., Spadaccini, C.M. and Lewicki, J.P. Shape-morphing composites with designed micro-architectures. Scientific reports, 6, 2016, p. 27933.
Gao, Y., Li, H. and Liu, J. Directly writing resistor, inductor and capacitor to composite functional circuits: a super-simple way for alternative electronics. PLoS One, 8(8), 2013, p. e69761.
Saengchairat, N., Tran, T. and Chua, C.K. A review: Additive manufacturing for active electronic components. Virtual and Physical Prototyping, 12(1), 2017, pp. 31-46.
Poblete Ramírez, V., Álvarez, M.P. and Fuenzalida Escobar, V. Conductive Copper-PMMA Nanocomposites: Microstructure, Electrical Behavior, and Percolation Threshold as a Function of Metal Filler Concentration, 2009.
Yunus, D.E., Shi, W., Sohrabi, S. and Liu, Y. Shear induced alignment of short nanofibers in 3D printed polymer composites. Nanotechnology, 27(49), 2016, p. 495302.

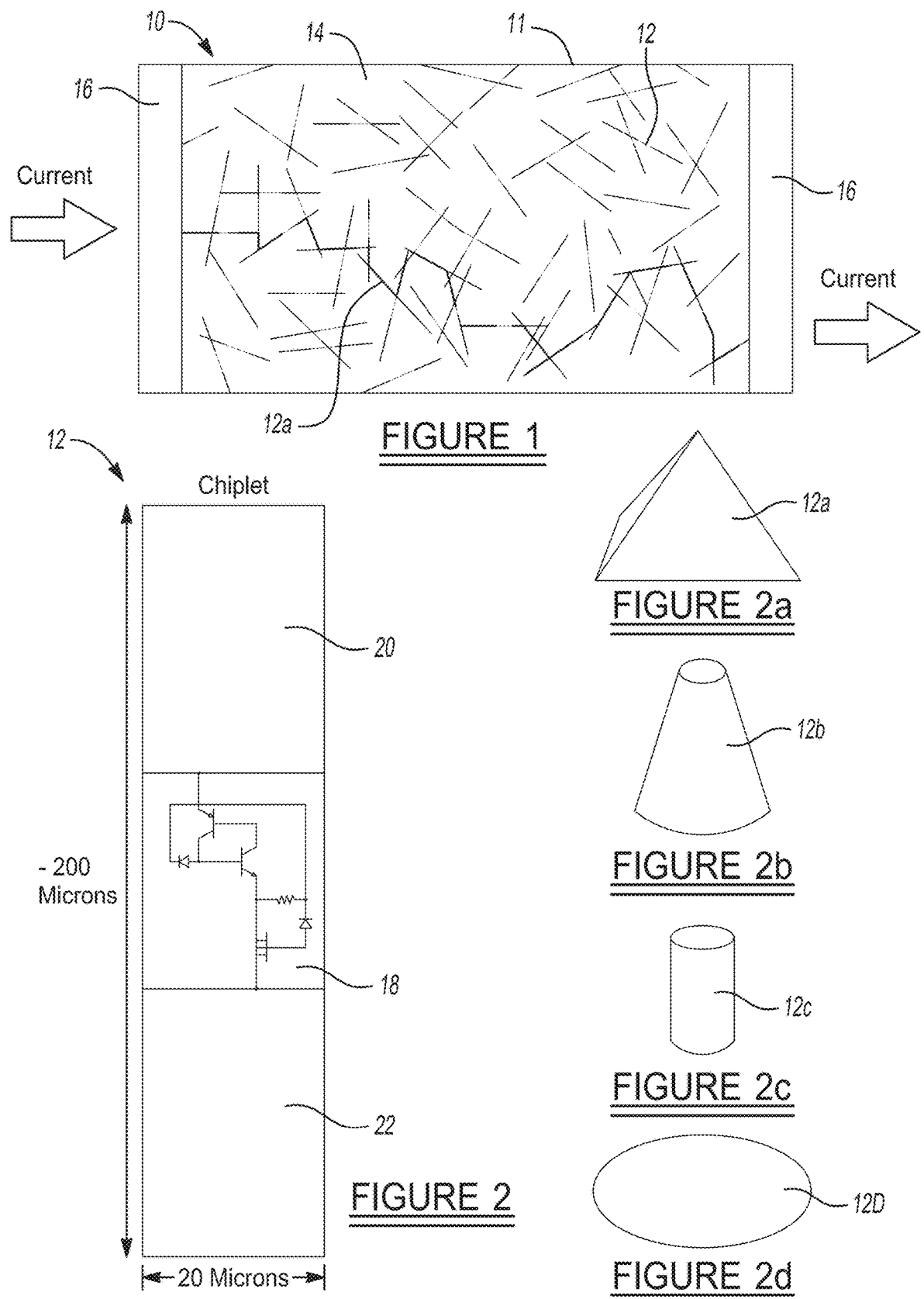

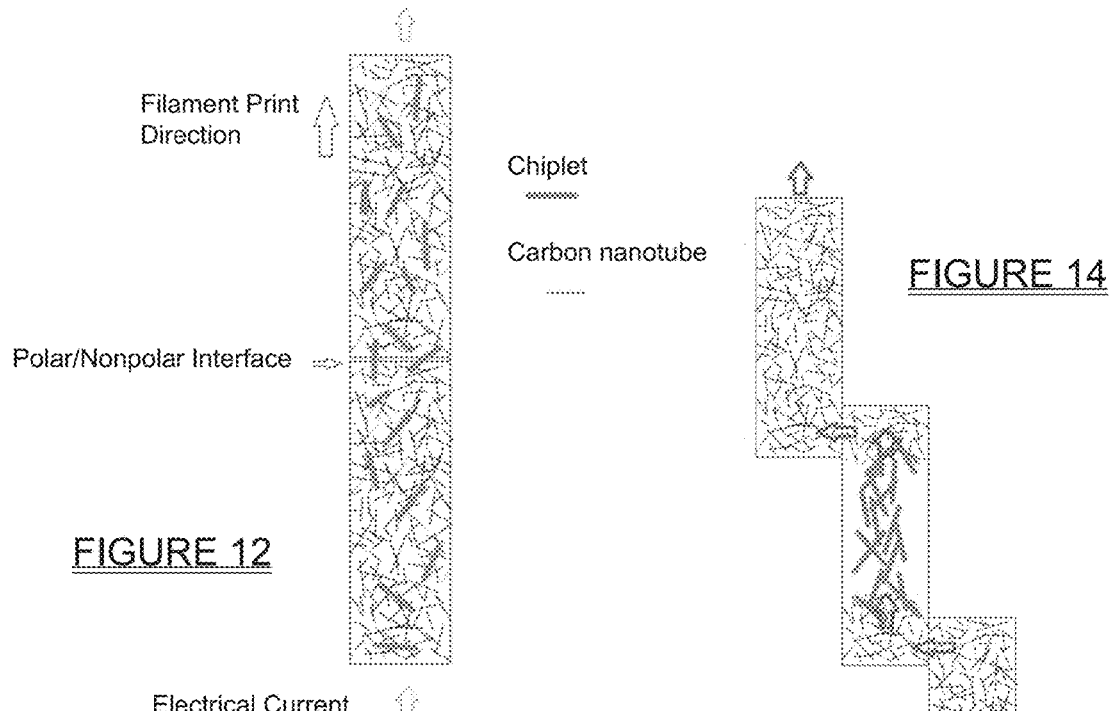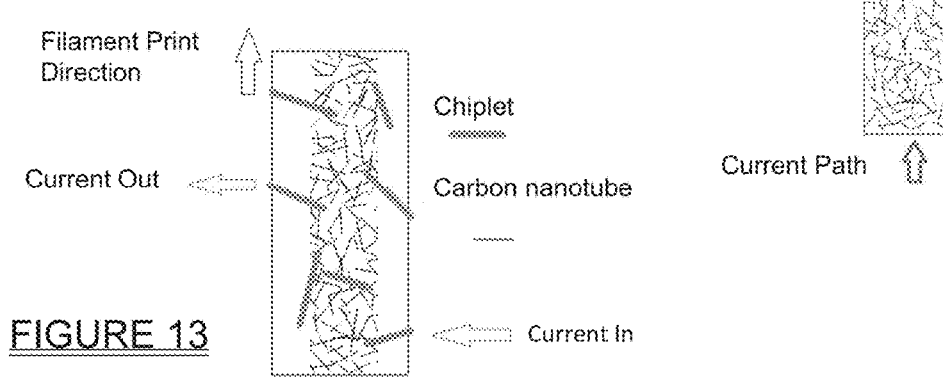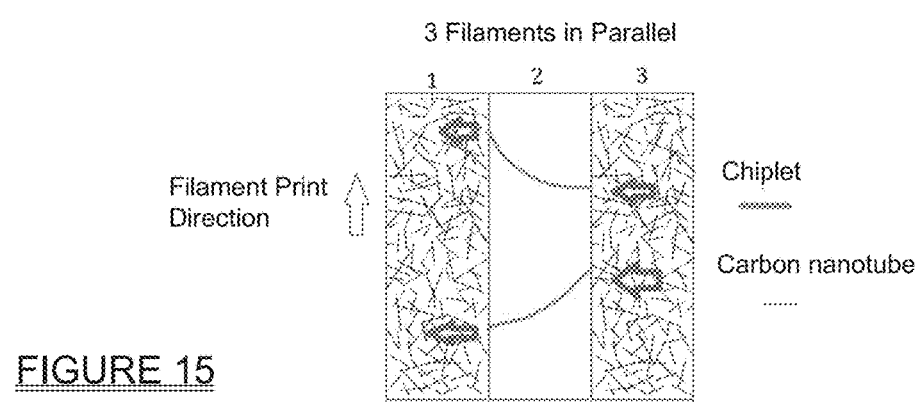

3D PRINTABLE FEEDSTOCK INKS FOR SIGNAL CONTROL OR COMPUTATION

CROSS-REFERENCE TO RELATED APPLICATIONS

This application is a divisional of U.S. patent application Ser. No. 16/219,188 filed on Dec. 13, 2018. The entire disclosure of the above application is incorporated herein by reference.

FEDERALLY SPONSORED RESEARCH OR DEVELOPMENT

This invention was made with Government support under Contract No. DE-AC52-07NA27344 awarded by the United States Department of Energy. The Government has certain rights in the invention.

FIELD

The present disclosure relates to 3D printable feedstock inks, and more particularly to a system and method for using the 3D printable feedstock inks to print one or more independent filaments to form a strand, where the strand may act as a signal control backbone to enable control over one or more subsystems by a selective application of signals to the strand.

BACKGROUND

This section provides background information related to the present disclosure which is not necessarily prior art.

Three dimensional ("3D") printing was invented in the 1980's, followed by four dimensional ("4D") printing in 2013. 3D printing is a multi-billion-dollar industry that allows for the production of novel and complex materials architectures that are too complex for conventional manufacturing. By using an analogy to the human body, it may be understood that 3D printing creates a skeleton whereas 4D printing creates both a skeleton and the "muscles" for actuation. It also allows for rapid prototyping and a high degree of customizability. 4D printing preserves the advantages of 3D printing, but also allows a print to change shape upon the application of a stimulus. This stimulus is generally applied to the entirety of the print simultaneously, causing all of the actuatable regions in the print to actuate together.

The use of 4D printing provides the mechanism of movement. 4D printing "muscles" are typically either printable shape memory polymers which will actuate to a secondary shape above a certain temperature, or hydrogels that actuate as they soak up solvent. Extensive research has gone into developing these 4D printable "muscles" or actuatable materials. Other printable materials may be actuated by light, pH level, a magnetic field, heat or even moisture. However, almost no research has gone into developing a fully printable and scalable "signal control backbone" that could be used to activate each "muscle" independently. Currently 4D prints are actuated either by immersion in a medium (heat, light, water, magnetic field etc.), which is not voxel specific, or by manually applying wires to various junctions to signal them independently using electricity.

There is a tangential field of development which involves researching 3D printing of electrical circuits and electrical components with conductive inks. The problem with trying to apply this to signal control needs is that electrical components and circuits require spatial layouts and arrangements that must be printed to work. All of these designs consume the design space from the rest of the 3D print. Trying to come into a print with printed or preassembled electronics severely limits the design space that you can produce. However, accessing complex designs is one of the advantages of 3D printing in the first place, and is precisely what one would want to preserve. It will also be noted that many designs are not full density, but rather a lattice-like architecture, further complicating attempts to use printed or preassembled electronics for signal control.

SUMMARY

This section provides a general summary of the disclosure, and is not a comprehensive disclosure of its full scope or all of its features.

In one aspect the present disclosure relates to a 3D printed signal control backbone apparatus. The apparatus may comprise a filament including a first material section and a plurality of second material sections. The first material section is bounded on opposing ends by the second material sections. The first material section may be formed by an ink having a percolating network of a plurality of chiplets infused in a non-conductive polymer. The plurality of chiplets form electrically responsive elements imparting a predetermined logic function and are responsive to a predetermined electrical signal. The second material sections are formed by an ink which is electrically conductive.

In another aspect the present disclosure relates to a method of forming a signal control backbone apparatus. The method may comprise using a 3D printing operation to print a first ink to form a first material segment which is electrically conductive. The method may further include using the 3D printing operation to print a second ink to form a second material segment contiguous to the first material segment. The second ink includes a plurality of electrically responsive chiplets which form a percolating chiplet network in each second material segment, with each chiplet having a predetermined logic function. The method may further include using the 3D printing operation and the first ink to print a third material segment contiguous to the second material segment such that the first, second and third material segments form a continuous first filament, with the second material segment disposed between the first and third material segments.

In still another aspect the present disclosure relates to a method for forming an electrically conductive ink able to be deposited through a print nozzle during a 3D printing operation. The method may include providing an electrically non-conductive flowable material adapted to be flowed through a print nozzle during a 3D printing operation. The method may further include mixing a predetermined quantity of chiplets, in accordance with a predefined percolation threshold, into the non-conductive flowable material to form a percolating chiplet network within the polymer as the ink is flowed through the print nozzle and deposited on a surface. The chiplets each form an engineered electronic component, and ones of the chiplets randomly connect, in accordance with the predefined percolation threshold, to form an electrically conductive circuit having a predetermined circuit characteristic.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. Corresponding reference numerals indicate corresponding parts throughout the several views of the drawings, in which:

FIG. 1 is a cross sectional side view of one filament showing a percolating network of chiplets forming a conductive path through a non-conductive material, together with electrodes placed on opposing sides of the filament;

FIG. 2 is a plan view of one embodiment of a chiplet that may be used to form a printable ink having predetermined electrically conductive characteristics;

FIGS. 2a-2d show different physical shapes that the chiplet of FIG. 2 may take, which include a pyramid, a frusto-conical shape, a cylindrical shape, and an elliptical shape;

Figure 3A:
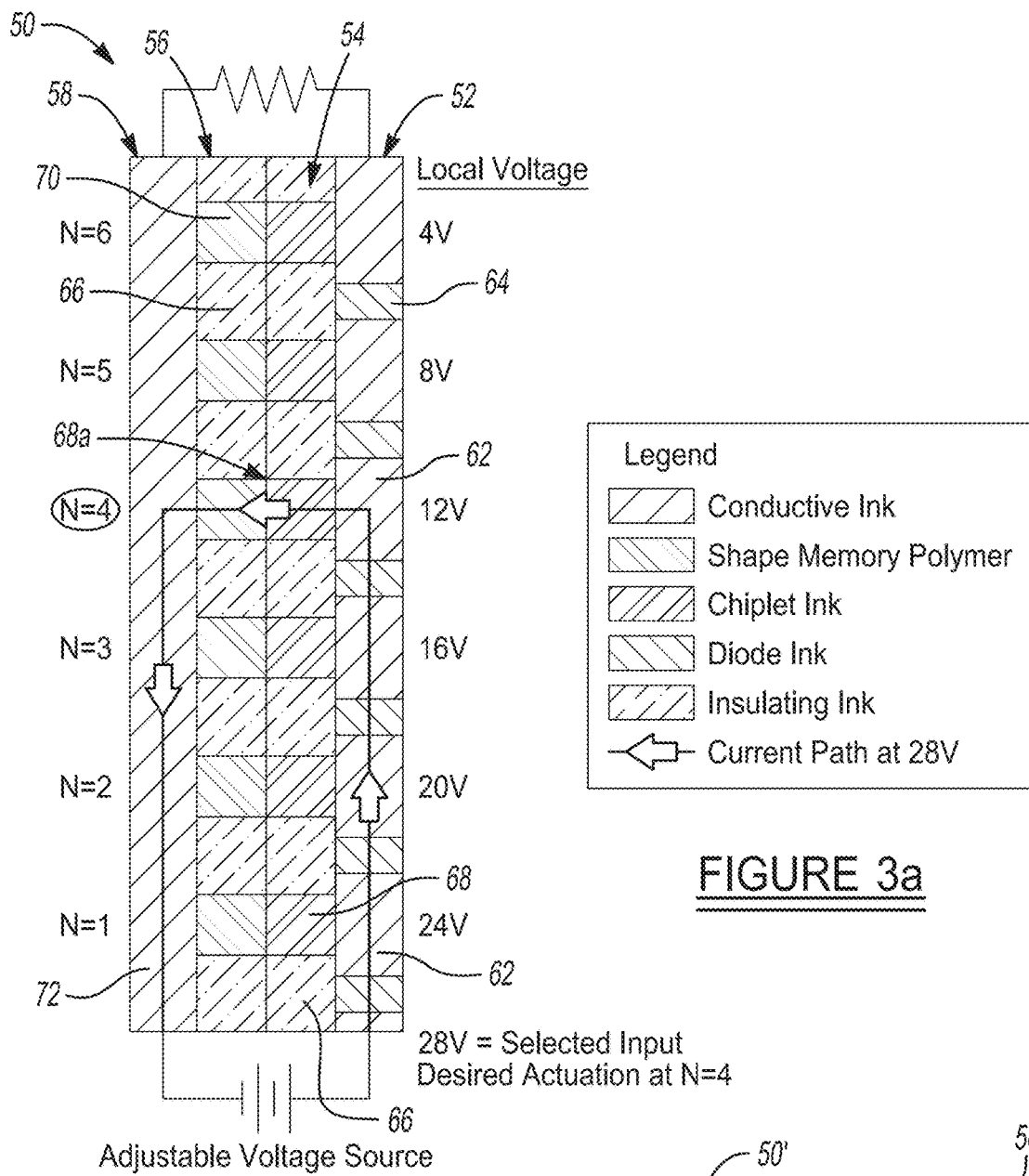
FIG. 3a shows one embodiment of a signal control backbone constructed by DIW printing a plurality of filaments together to form a strand, where the chiplet infused ink portions define a voltage at which a circuit may be completed through the strand.
Figure 3B:
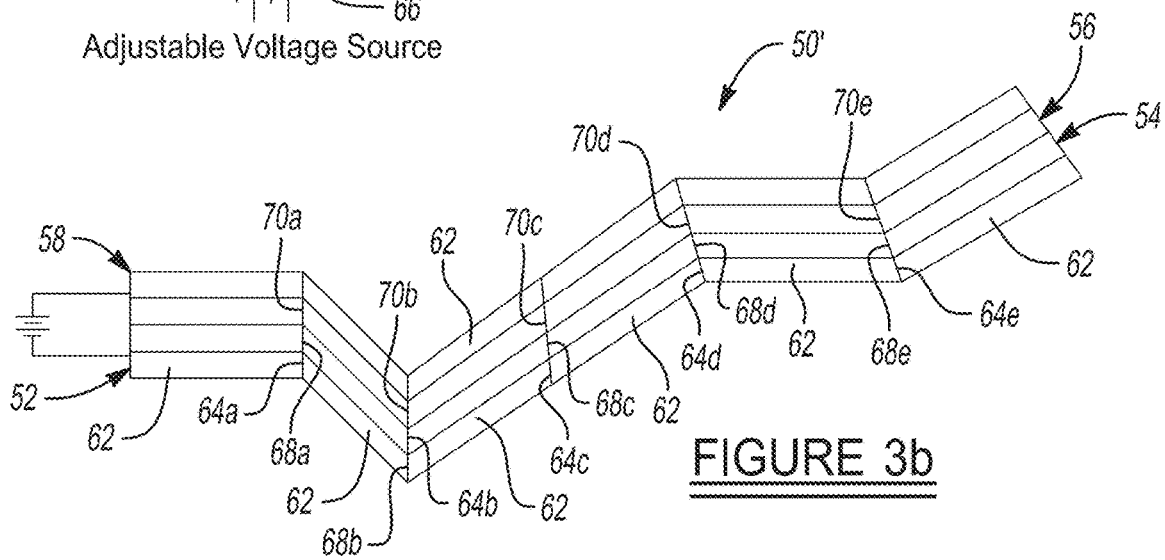
FIG. 3b shows a diagrammatic representation of another embodiment of the signal control backbone illustrating how a plurality of separated junctions formed by the chiplet ink sections could be constructed using chiplets which are responsive to different signal characteristics (e.g., voltage ranges), and individually actuated to enable folding of the strand in different orientations.
Figure 3C:
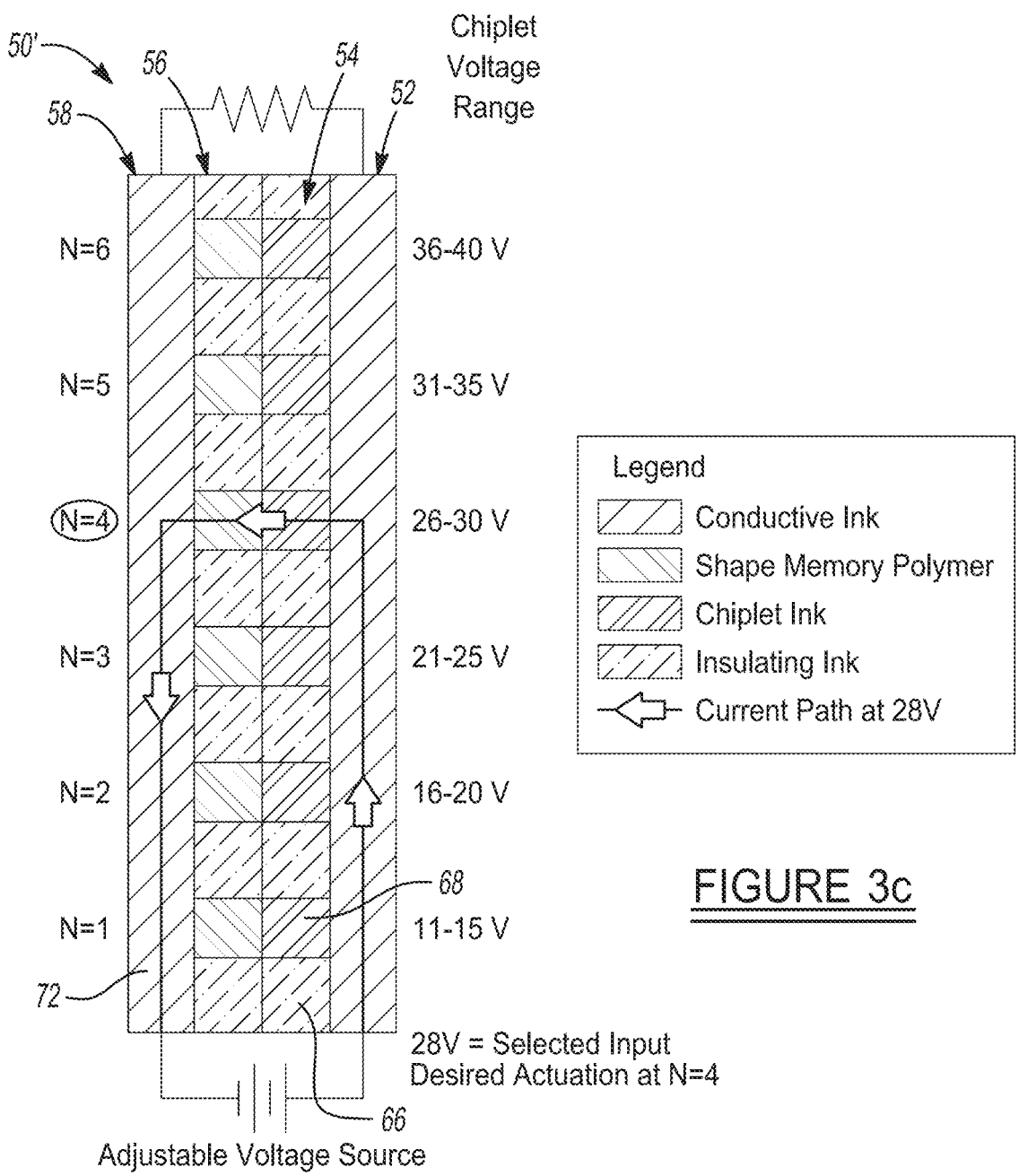
Figure 4:
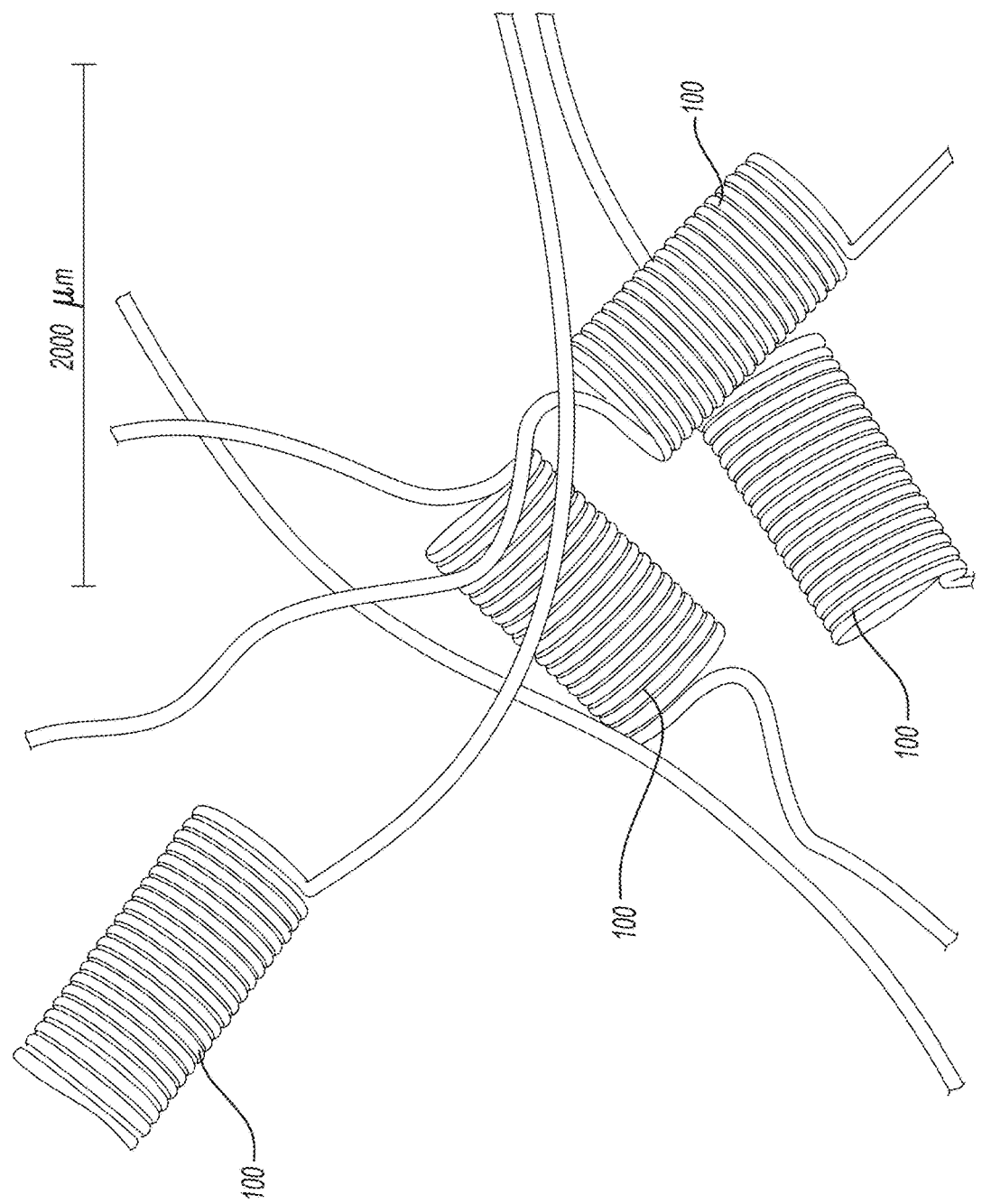
Figure 5:
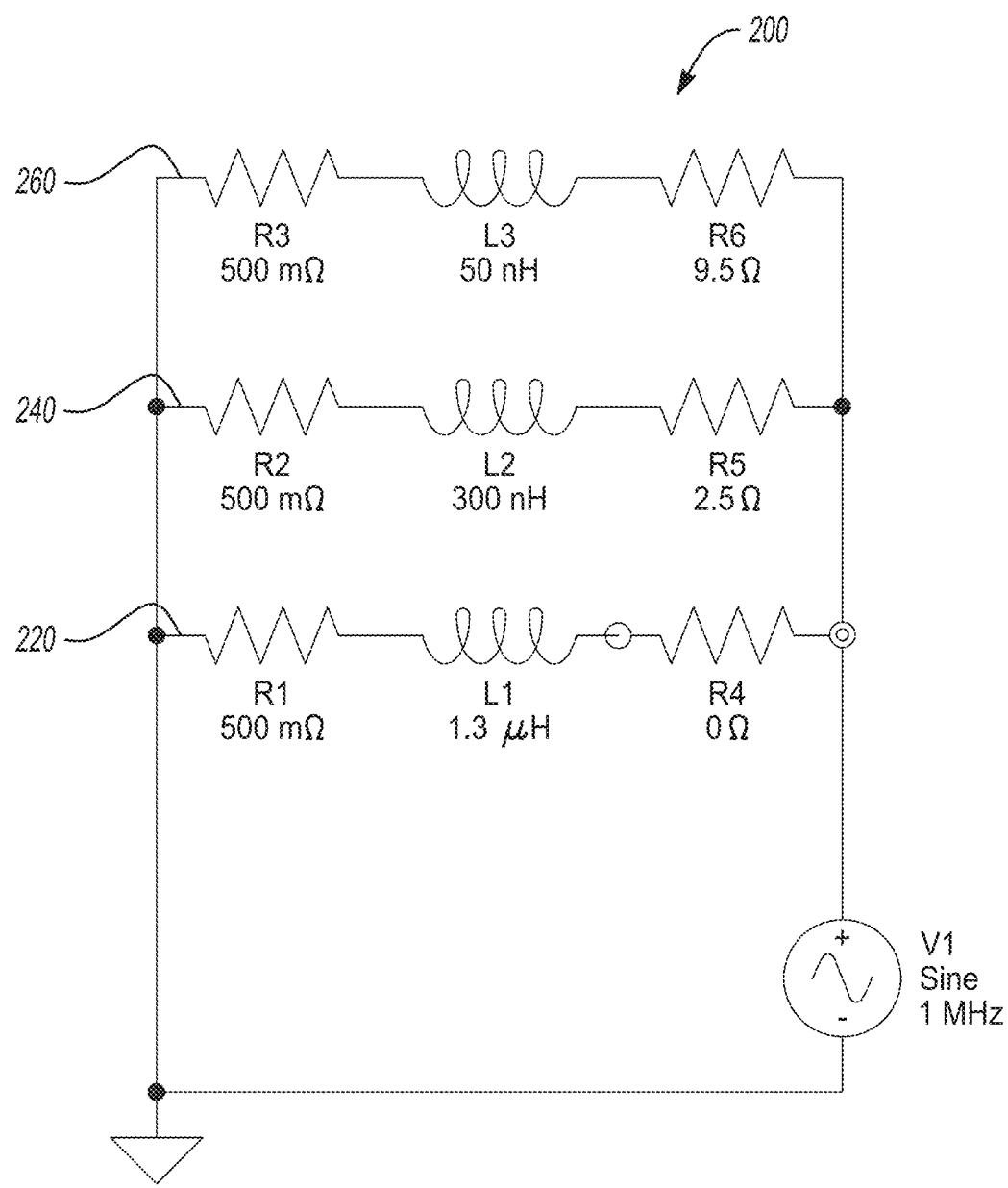
Figure 6:
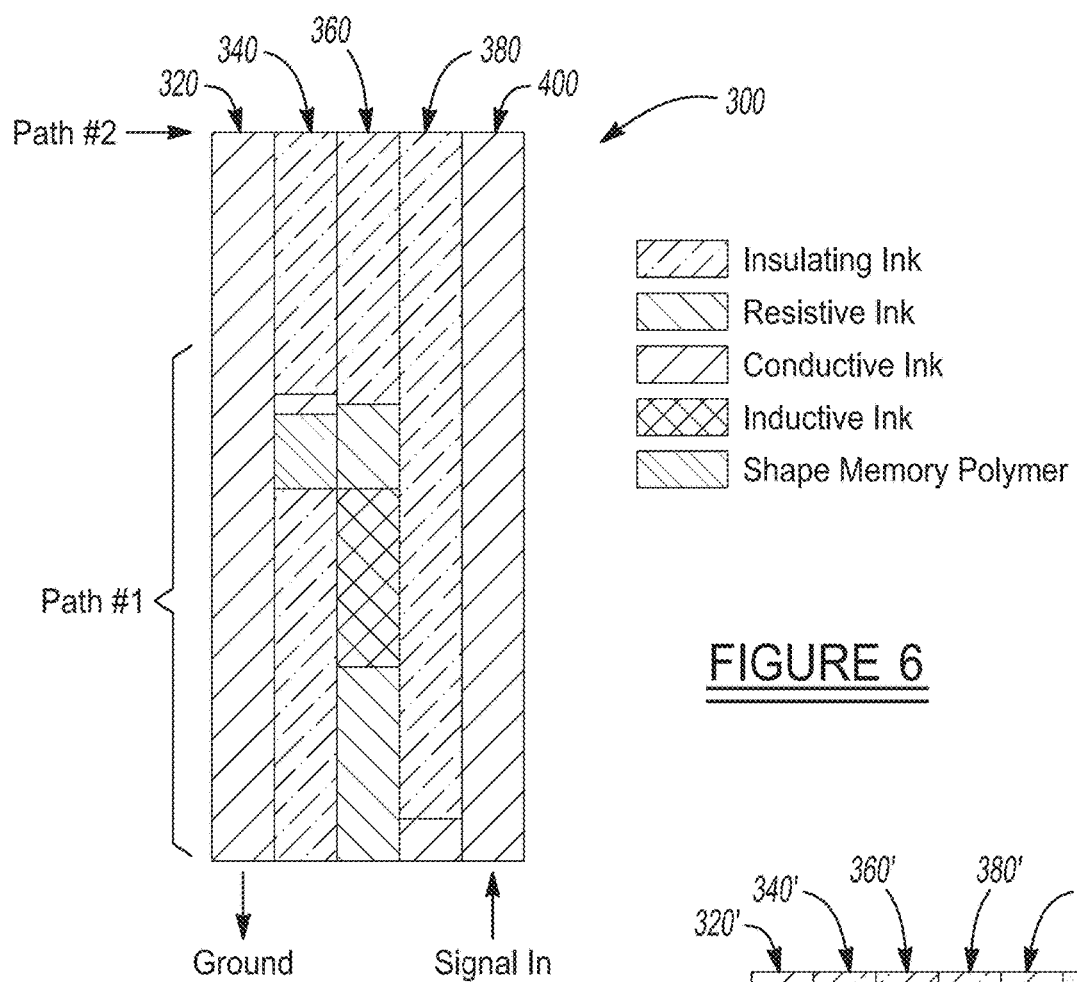
Figure 7:
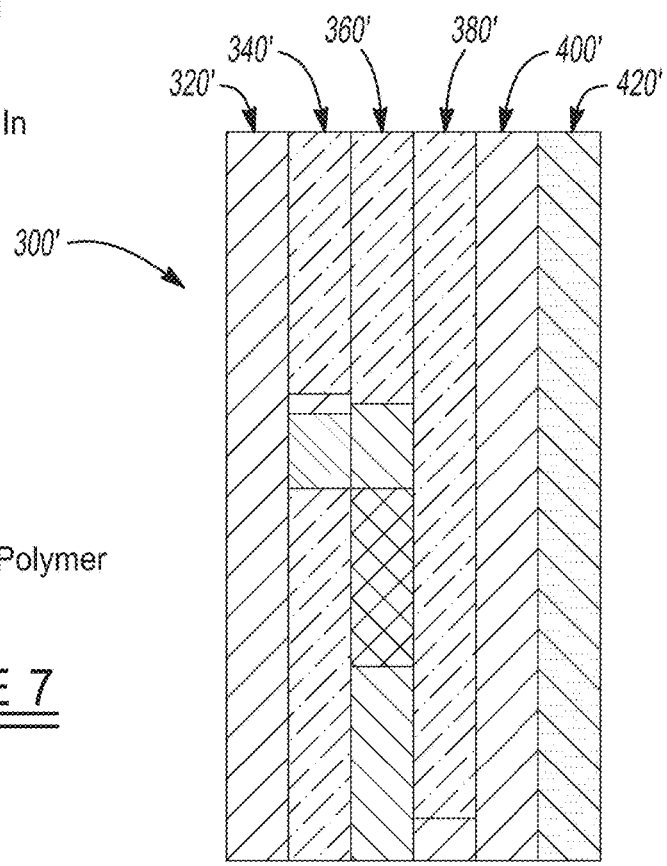
Figure 8:
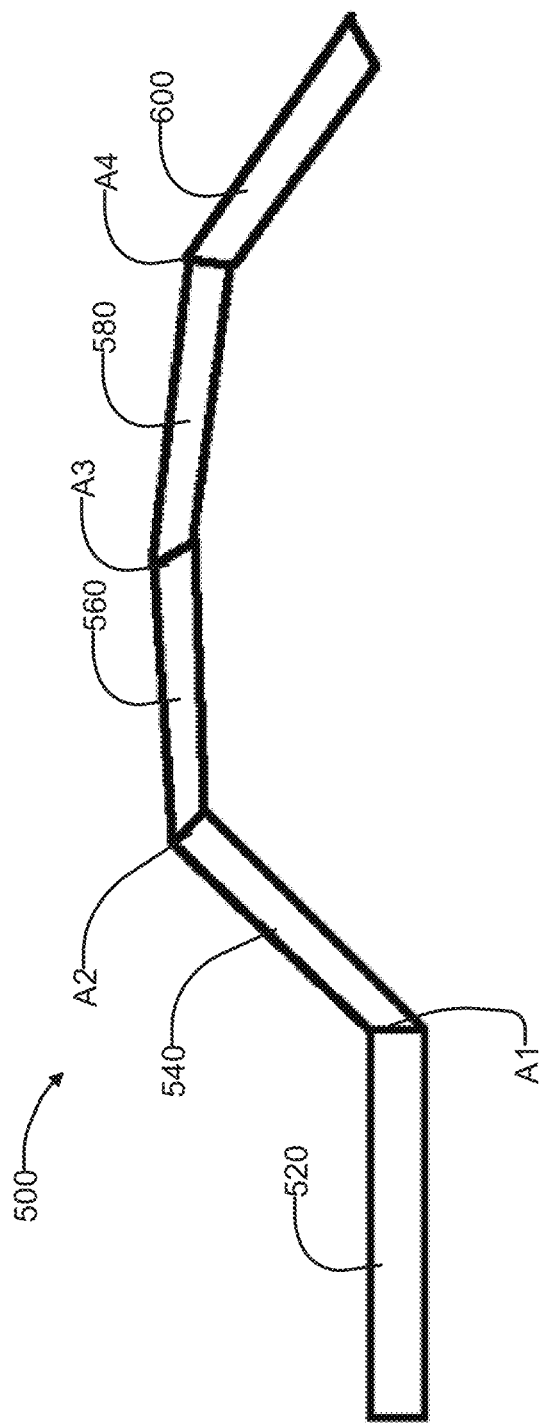
Figure 9:
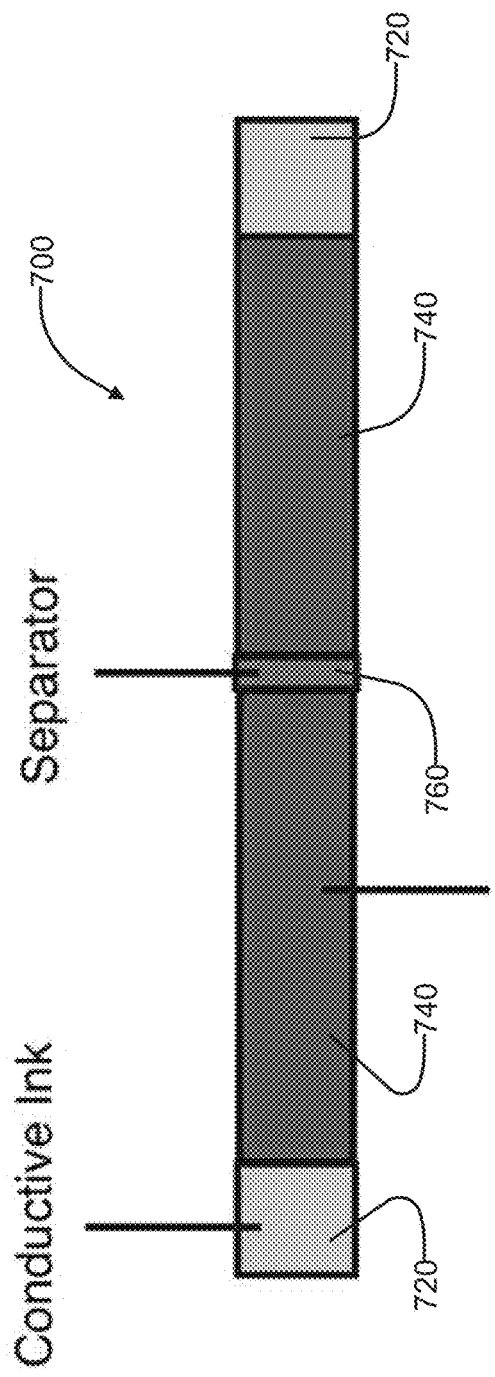
Figure 10:
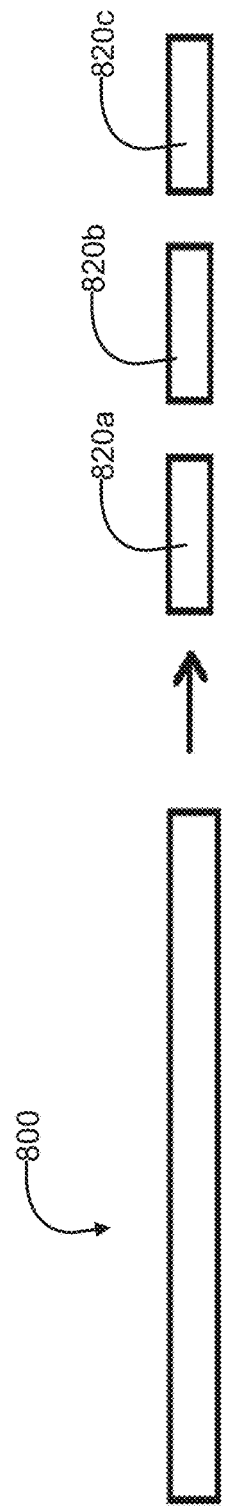
Figure 11:
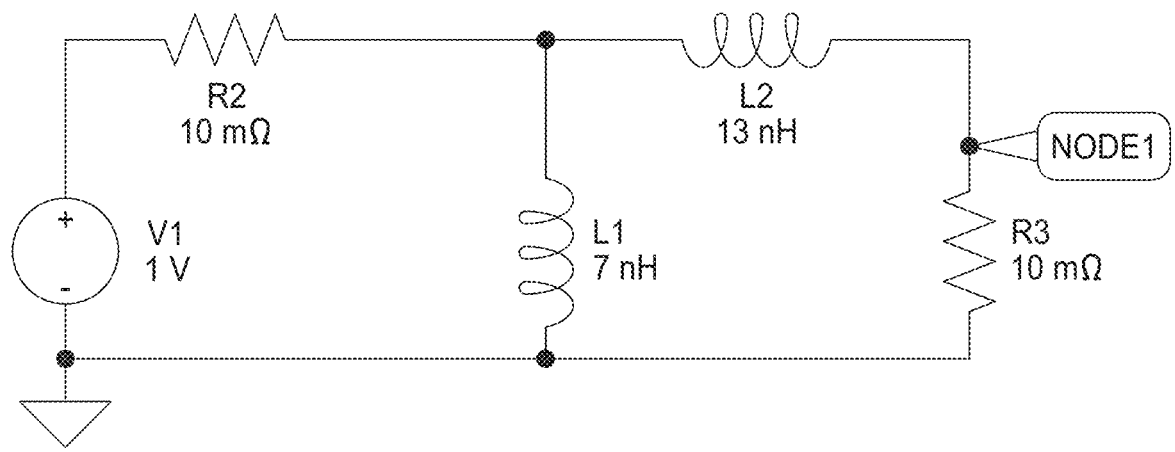

FIG. 3c a more schematic diagram of the signal control backbone of FIG. 3b, where the chiplet infused ink portions define different voltage ranges at which a circuit may be completed through the strand;

FIG. 4 is a photograph of interconnected micro coils obtained from Piconics, Inc.;

FIG. 5 shows an example of a circuit that may be printed, using a DIW system, as a strand made up of a series of parallel filaments;

FIG. 6 shows a strand forming another example of a signal control backbone, in which a plurality of five separate filaments are positioned adjacent and parallel to one another, with a subplurality of the filaments having differing constructions;

FIG. 7 shows another example of a signal control backbone which incorporates a line having a specific functional characteristic or quality, in this example a conductive line;

FIG. 8 shows another embodiment of a strand which forms a signal control backbone, made in accordance with the present disclosure, which includes a plurality of distinct sections A1-A4 separated by actuator sections, and where the actuator sections may be selectively actuated via external control signals (e.g., externally applied voltage signals) to allowed controlled movement about four axes defined by the actuator sections A1-A4, and thus enable the strand to perform a slithering movement;

FIG. 9 shows one example of a printable supercapacitor using a microporous carbon and electrolyte loaded ink, printed in conjunction with a separator ink and a conductive ink; this may be used to power the signal control backbone;

FIG. 10 shows another example of a signal control backbone manufactured in accordance with the present disclosure in which weaknesses or inclusions of chemicals, are formed in the printed strand forming the signal control backbone, that either may ignite or deteriorate at specific junctions when triggered, and thus cause the strand to divide into a series of smaller strands;

FIG. 11 one example of a bandpass filter having inductors and resistors, which may be printed using parallel filaments;

FIG. 12 shows a simplified diagram to illustrate a first alternative implementation option for addressing possible nozzle clogging caused by chiplets which are too highly concentrated to enable continuous, uninterrupted flow through a printing nozzle, where two conductive inks are used, one which is polar and one which is nonpolar, and where one of the inks uses carbon nanotubes or a different element to substitute for the chiplets;

FIG. 13 shows a second implementation option in which the pressure gradient and shear forces associated with DIW printing may be used to create regions having differing densities or alignments of chiplets and carbon nanotubes;

FIG. 14 shows a third implementation option which uses a gradient of carbon nanotubes to ensure the electrical connection across parallel filaments; and FIG. 15 shows a fourth implementation in which a single chiplet spans the entire filament perpendicularly relative to the filament.

DETAILED DESCRIPTION

Example embodiments will now be described more fully with reference to the accompanying drawings.

The present disclosure involves incorporating miniaturized electronics into the feedstock ink itself, without significantly constraining ability of depositing feedstock ink through a conventional printing nozzle. The system and method of the present disclosure, in one implementation, employs a technique called Direct Ink Write ("DIW"), which entails extruding a feedstock from a printing nozzle with a small diameter nozzle opening. By controlling the motion of the nozzle relative to the build plate, a 3D print is built up layer by layer, typically in a continuous toolpath fashion, by selectively depositing the extruded feedstock from the printing nozzle. The present disclosure is also likely applicable with the 3D printing technique known as Fused Deposition Modeling, which is a commonly used 3D printing technique.

The difficulty of assembling electrical circuits within an extruded feedstock ink results from the fact that solid components mixed into a liquid and extruded through a fine nozzle come out with at least partially random spatial arrangements and orientations. Solid components may experience some alignment effects in the flow direction. Controlling the degree of alignment is desirable. Using a cylindrical nozzle versus a conical nozzle may reduce the shear alignment in the direction of the flow. Alternatively, electric or magnetic fields may be additionally used to tune the alignment of the solid components. Wiring a circuit as one might do on a breadboard is impossible in an extruded ink. This issue is addressed through a new field which may be termed "Printable, Percolating Electronics." Here, percolation theory is used to create circuit equivalents that do not require high specificity in spatial arrangement or orientation of the solid components.

One inspiration for the present system and method is the structure discussed in "Shape-morphing composites with designed micro-architectures" published in 2016 by LLNL employees. In this paper a shape memory polymer that is electrically conductive was created. As a demonstration, the shape memory polymer was actuated to fold on itself by applying a low current through the print for resistive heating.

This serves as an ideal "muscle" to be controlled using a "signal control backbone", which is an important feature of the present disclosure.

Figure 1A:
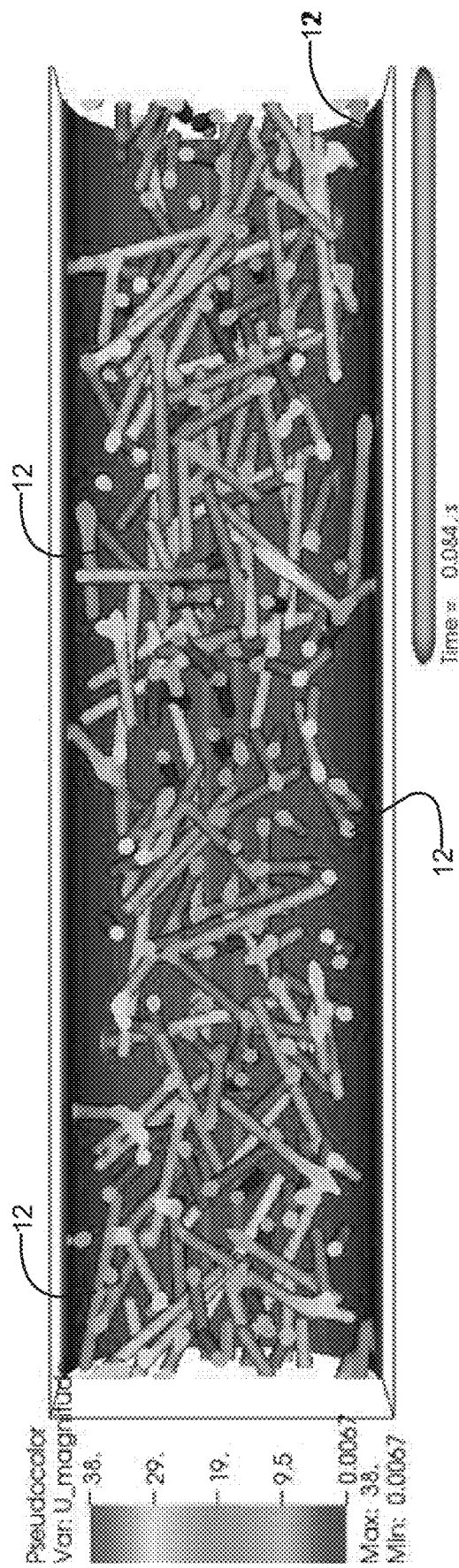
FIG. 1a shows a simulation of chiplets partially aligning during extrusion through a flow nozzle.

Initially, FIG. 1 shows a side view cross section of a portion of a printable ink 11 that is used to form a filament 10. The ink 11 includes a plurality of "chiplets" 12 which form a percolating "chiplet network" which are suspended in a non-conductive flowable material 14, which in one example may be an electrically non-conductive polymer. One of the chiplets 12 is shown in highly enlarged fashion in FIG. 2. In this example the dashed line 12a in FIG. 1 represents a plurality of individual chiplets 12 being in contact to form a contiguous uninterrupted current flow path through the non-conductive material 14. The chiplets 12 may be manufactured as miniature logic circuits to have a predetermined circuit function. For example, and without limitation, the chiplets 12 may be manufactured to provide logic equivalent to a diode, a Zener diode, a silicon controlled rectifier, a resistor, a transistor or a capacitor, or possibly even a combination of two or more of such components/logic circuits. As shown in FIG. 1, the chiplets 12 are randomly oriented within the non-conductive material 14 as the ink 11 is flowed through a printing nozzle, but form a plurality of percolating chiplet networks within the ink 11 as the chiplets 12 contact one another. The density of the chiplets 12 within a given volume also is selected by the designer using simulations as a guide for estimating the percolation threshold. FIG. 1a shows a simulation of the chiplets 12 aligning during extrusion through a flow nozzle. Dashed line 12a in FIG. 1 shows one complete circuit path being made through the filament 10 using the randomly oriented chiplets 12. In this example electrodes 16 are provided on opposing sides of the filament 10.

The formation of percolating networks of the chiplets 12 within the ink 11 is dependent on a number of factors. Such factors may include the chiplet 12 size, shape and the overall width or diameter of the filament 10. In addition to these parameters, the carrier polymer rheology (i.e., the rheology of the non-conductive material 14), and print parameters may influence defining a critical threshold at which the percolating networks are formed in the ink 11. Even changing the DIW flow rate of the ink 11 and the standoff height of the nozzle being used to deposit the ink 11 will likely affect shear forces and shear induced alignment of the chiplets 12, thus potentially altering the percolation threshold. Chiplet particle size and volume loading should also be considered along with the ink 11 rheology; too few chiplets and percolating clusters of the chiplets 12 will not connect, while too many chiplets 12 and a percolation network between the conductive end portions of the chiplets 12 may form, shorting out the chiplets 12. The chiplet orientation depends on the chiplet size. If the chiplets are too small they may align in the direction of the flow. A mix of chiplets of different sizes and shapes defined from the simulations can be used.

As shown in FIG. 2, each chiplet 12 may have a logic section 18, with an input to the logic section in communication with a first conductive leg 22, and an output connecting with a second conductive leg 20. The dimensions of the chiplet 12 may vary significantly, but one important constraint is that they must be sufficiently small to be able to flow through the opening of a printing nozzle being used in a 3D printing system. In one example the chiplet 12 may have a length of about 200 microns, a width of about 20 microns, and a thickness of about 20 microns. However, these dimensions are merely one example of the size that the chiplet 12 may have and still be easily distributable to form a percolating chiplet within the non-conductive material 14. The shape of the chiplets 12 need not be rectangular, but instead could have virtually any three dimensional shape. For example and without limitation, the chiplets 12 may have a pyramid shape (chiplets 12a in FIG. 2a), a frusto-conical shape (chiplet 12b in FIG. 2b), a cylindrical shape (chiplet 12c in FIG. 2c) or an elliptical or oval shape (chiplet 12d in FIG. 2d), etc.

Using the chiplets 12 to form the printable ink 11 having percolating chiplet pathways enables filaments to be printed, within which current flow through the filament can be tailored or controlled. More particularly, the percolating chiplet pathways enable 3D printed components made up of a plurality of 3D printed filaments to be constructed in a manner that forms a signal control "backbone". The cured 3D printed component enables voxels of the cured 3D print to be individually targeted for actuation by electrical signals, without constraining the 3D design geometry.

One example of how such a single strand may form a signal control backbone 50, constructed using a plurality of different inks, is shown in FIG. 3a. Filaments 52, 54, 56 and 58 are printed adjacent one another to effectively form a single strand. Filament 52 is printed with alternating sections of conductive ink 62 and diode ink 64. The diode ink 64 is ink that forms a predetermined voltage drop across it, in this example 4V. The diode ink 64 is comprised of a percolating network of chiplets that act as diode equivalents. To avoid confusion, these will be called "diode chiplets". Each diode chiplet may be comprised of one or more diodes in series, including possibly Zener diodes. The diodes may be arranged in a single polarity direction or in opposite polarity directions to make the chiplets symmetric when rotated by 180 degrees. The diode chiplets may also incorporate other components such as transistors, thyristors or silicon-controlled rectifiers to make latching circuits on the diode chiplets. Strand 54 includes alternating sections of insulating ink 66 and chiplet infused ink 68. Filament 56 includes alternating sections of the insulating ink 66 and a shape memory polymer 70 ink. Strand 58 is formed using the conductive ink 62. With this construction, it can be seen that the chiplet infused ink 68 has been designed to enable current flow when the voltage drop across it is at a predetermined level. This enables a conductive path to be formed through the chiplet ink section 68a once the voltage in filament 52 has dropped to about 12V, relative to filament 58. Once this occurs, a complete circuit path 72 is formed during which current flows through one of the shape memory polymer sections 70. This allows a control action to be implemented using at least one of the electrically "activated" shape memory polymer sections 70.

The control action is set by choosing the voltage applied across filaments 52 and 58 at the base of the strand or print. The regions of diode ink printed successively and interspersed with conductive ink (filament 52) create a "voltage ladder". This means that the voltage at each successive region along the filament 52 is lower than the voltage at the prior region by a specific amount. With diodes or Zener diodes, the voltage drop is extremely regular and constant for each region. In one implementation, the voltage drop across each region could be set by the printed length of that region (with diode ink). In another implementation, the voltage drop across each region is largely independent of the printed length of the diode ink (if the diode chiplets are latching). In another implementation, the diode ink is replaced with a resistive ink and the voltage drop across each region of the filament print is set by a conventional voltage divider type circuit. Thus each "rung" of the voltage ladder, or equivalently successive spatial region of the printed filament has a set voltage, that is directly determined by the input voltage across the base of the filament. In one implementation, all of the chiplet ink regions have the same voltage response (will become conductive for the same voltage drop). Thus only at a specific spatial region of the print is the voltage drop within the correct range to allow for activation of the chiplet ink, and the establishment of a closed circuit through that activated chiplet ink. It will be appreciated, then, that at least two distinct types of chiplets may be formed, one which is dependent on the voltage drop, and the other which acts as a diode or series or diodes. This will be explained further in the following paragraphs. This current flow in turn locally activates the shape memory polymer. In order to select a different region to target, a different base voltage is applied. This changes the starting voltage on the voltage ladder and the subsequent mapping of voltages to spatial locations along the voltage ladder. This allows for targeting of a different spatial region for actuation, simply by changing the voltage applied across the filament base. Using only one type of chiplet and one type of diode chiplet simplifies both chiplet manufacturing and the printing process.

In an alternative implementation, the signal control backbone 50' is shown in a diagrammatic, simplified form in FIG. 3b to illustrate how selective bending or flexing of different distinct regions of the signal control backbone 50 may be achieved, depending on backbone activation occurs. FIG. 3c shows the signal control backbone 50' in a more traditional schematic drawing. In FIGS. 3b and 3c, the signal control backbone 50' may have chiplet ink sections 68 that have different voltage responses or logic. FIG. 3b expressly shows lines 70a-70e representing junctions where the shape memory polymer ink sections are located. Locations 68a-68e illustrate where the chiplet ink sections may be located. In this example the chiplet ink sections 64a-64e are constructed such that they differ from one another in their electrical and/or logic characteristics so that each is responsive to a different applied voltage, or to voltages within different, non-overlapping voltage ranges. Thus, selected ones of the shape memory polymer inks 70 can be independently activated depending on the signal voltage applied to its adjacent chiplet infused ink section 68. Still further, rather than being tuned to respond to a specific voltage or voltage range, the chiplet infused ink 68 may be constructed to permit conduction only while the voltage is below an upper voltage threshold, or only when the voltage exceeds a predetermined upper threshold. The chiplets 12 may be constructed to act as latches such that once they are activated, they remain in a conducting state even if the voltage is removed.

It will be appreciated that chiplets may become conductive only if multiple successive voltage ranges are activated. This would create a series of latching components incorporated into the logic circuit. Each component latches for a specific voltage range, but the entire chiplet only becomes responsive (e.g., conductive) if all of the necessary voltage ranges are latched. This type of chiplet has the advantage that the signal control backbone 50 is no longer limited by the number of voltage ranges that can be accessed. Instead, by using combinations of voltages, one can exert an exponentially greater degree of control over the entire signal control backbone 50 or 50'.

It will also be appreciated that while the diode ink sections 64 have been shown in FIG. 3 to be uniform and evenly spaced along the filament 52, this uniform size and spacing is not necessary. The filament 52 could be constructed with sections of diode ink sections that provide a decreasing or increasing voltage drop across the length of the filament 52. Such may be accomplished by controlling the dimensions of each of the diode ink sections 64 when forming the filament 52. This provides even further design flexibility in constructing a signal control backbone.

The signal control backbone described herein allows signals to be sent independently to specific, selected subsystems or material sections (referred to in one example as "muscles") so that the selected muscles may be actuated selectively. The present disclosure further discloses a method for creating a fully printable signal control backbone that allows targeting of each input signal (or stimulus) to a specific region or actuation zone within the printed structure or part. The signal control backbone is able to carry electrical signals to specific voxels anywhere in the 3D print and can be controlled from only two electrical contact points. The signaling device may thus be external or internal to the printed structure, with the electrical signal carried through 3D printed material filaments, such as one or more of filaments 52, 54, 56 and 58 described above, within the printed structure or part. The chiplets 12 form the electronics or logic that provide the unique control characteristics to each 3D printed part, and are fully internal to the feedstock ink and fully printable using conventional 3D printing techniques. Thus, adding signal control capability in this fashion does not significantly alter the 3D printing process.

In one specific implementation, the present disclosure involves creating a distinct form of programmable matter using additive manufacturing, specifically DIW. The programmable matter takes the form of a long, thin strand, one example being strand 50, which in one form may be about 2 mm in diameter, that has actuating joints at regular (or possibly even irregular) intervals. The actuating intervals may be spaced at selected intervals along the length of the strand, for example spaced at a distance of less than 3 cm from one another. Each actuating joint can be triggered to bend at a predetermined angle upon the application of minimal heating. Moreover, each joint can be actuated individually using a specific electric signal, for example leading to resistive heating, without the need to actuate any other joints. Thus, specific joints can be actuated separately to bend the strand into a number of shapes and configurations whose possibilities grow permutationally or exponentially. The actuation may be latching so that it remains actuated when the signal is removed, or reversible so that when the actuation signal (e.g., resistive heating) is removed, the joint returns to its initial or "rest" configuration.

A strand with controllable shape (after it is printed) has many potential applications (both simple and complex) that are outlined in the following "Applications" section. Each strand may be comprised of a plurality of DIW write filaments, one example being one or more of the filaments 52, 54, 56 and 58, which each may be of a desired diameter. In one example the filament diameter may be about 0.5 mm. The DIW filaments may be printed parallel to and in contact with one another. The filaments in this example create both the actuators and the functional logic for controlling the actuators, in a straightforward, easily printable way. When DIW printed to form a bundle of, for example 4-5 filaments, the filaments form what may be termed a "super-filament" or a "strand". For convenience the following discussion will use the term "strand."

As the strand is fully printable and scalable, it is inexpensive and can be easily produced in mass quantities. The strands described herein provide significant versatility in creating DIW structures. The strands described herein are also sufficiently inexpensive so as to be mass producible, and possibly even disposable in a number of specific situations (for example, as will be touched on in the following "Applications" section).

The DIW printed strands described herein may then be used to print larger lattices or structures, as is typical in DIW printing applications. These larger structures are then able to be selectively actuated to form a variety of shapes from a single printed structure. The actuation may be controlled, in one example, by sending an AC signal of a specific magnitude, polarity or frequency down the conductive filaments. If using an AC signal to control actuation of specific joints, then the number of distinct joints that can be included and selectively actuated along a long length of each strand may be limited only by the number of distinct AC frequencies that can be applied. The mechanism of control is elaborated on in the following "Circuit" section.

Materials

At least five distinct, functional inks may be used in the construction of one strand.

1) A flexible, electrically insulating ink, for example, silicone.

2) A flexible conductive ink.

3) A resistive ink having less conductivity than a conductive ink, and which may or may not be flexible. The resistive ink may be achieved by loading a silicone with a powdered carbon fiber and controlling the solids loading to control the conductivity.

4) A shape memory polymer that can be printed.

5) An inductive ink in which inductors are made of conducting coils that resist a change in current due to the magnetic field set up in the coil and Lenz's Law. When joined in series, the inductance of several inductors adds directly (Equation 1 below). When added in parallel, the inductance of several inductors adds reciprocally (Equation 2 below).

$$L1+L2+L3=\text{Ltotal} \quad \text{(Equation 1)}$$

$$1/L1+1/L2+1/L3=1/\text{Ltotal} \quad \text{(Equation 2)}$$

Micro-inductors are often used for high frequency AC signals in cell phones. The world's smallest commercially available inductor used in cell phones is presently manufactured by Murata with a diameter of ~200 microns, a high quality factor (Q=21), and an inductance of up to 10 nano Henries. Of similar principle are micro coils, used in NMR, which are very small conductive coils with diameters typically ranging from 10 to 500 microns. Micro coils may be fabricated in a number of different processes including LIGA, bulk micromachining, microinjection molding, and plating biological spirals (e.g. *spirulina*). One example of such a micro coil 100 is shown in FIG. 4.

To synthesize an inductive ink, the micro coils 100 shown in FIG. 4 may be suspended in an insulating polymer. One challenge of synthesizing an inductive ink is to obtain sufficient loading of the micro coils 100 to create a continuous conductive pathway of the micro coils 100 in series, while minimizing the number of parallel pathways. Thus, one is able to maximize the inductance per centimeter of inductive ink printed. As will be appreciated, an inductive ink may be expected to have wide reaching applications in additive manufacturing applications.

Careful control of the solids loading of the micro coils 100 in the ink will be necessary. The precise solids loading needed is dependent on the dimensions of the micro coils and the dimensions of the filament and may be approximated with simulation.

One may also align the micro coils 100 by applying a current, or current and magnetic field, during the curing process as the micro coils 100 cure within an insulating polymer. Furthermore, the inductance may be increased by adding a ferrofluid or magnetorheological fluid to the ink. These may be cured within the ink to form a magnetorheological elastomer. These are generally nonconductive, but increase the permeability, and thus can increase the inductance by up to orders of magnitude. This is similar to adding an iron core to the center of a large inductor.

Circuit Design

While a number of designs have been considered (i.e., which are elaborated on in the following "Alternate Designs" section), one example of a more straightforward design that is effective is shown in FIG. 5. A frequency-sensitive current divider circuit 200 is assembled by joining select values of resistors and inductors in parallel across an input line and a ground line. Each path 220, 240 and 260 has two resistors and an inductor linked in series. The electrical impedance of each series component in each of the legs 220, 240 and 260 adds constructively. The inductors shown in FIG. 4 may be assumed to each be an ideal inductor with finite reactance, but no resistance. Real inductors always have some resistance, but this this has no effect on the circuit design as that resistance is assumed to be incorporated into the resistance of the rightmost resistor of each path. While the resistors have set values of resistance for all frequencies of alternating current (AC), the inductor will have a different impedance for each frequency of AC. In this example pathway 220 has high inductance and low resistance while pathway 260 has high resistance and low inductance. Pathway 2 is intermediate. This sets up a current divider where the majority of the current flows through a different path for different AC frequencies.

The power dissipated (as heat) through a resistor is given by the product of the resistance and the square of the current ($I^2R$). An ideal inductor dissipates no power, so all of the power is dissipated in the two resistors per path. Resistors R1, R2 and R3 are the resistors of interest as they are the "actuating resistors", those that heat up the actuating shape memory polymers. The frequency of the applied signal dictates the amount of current flowing through each inductive-resistive pathway. The power dissipated in each resistor is directly proportional to the temperature increase in that resistor (by multiplying by the thermal resistance, which is identical for resistors R1-R3). By placing shape-memory polymer "actuator 1" next to resistor one, and so forth, one is able to establish a means of selectively heating, and thus selectively actuating, the various actuators.

Circuit 200 of FIG. 5 may be printed using a DIW system as a strand made up of a series of parallel filaments. One example of such a strand 300 is shown in FIG. 6, which illustrates filaments forming five separate filament layers 320-400 positioned adjacent and parallel to one another. Assuming each filament 320-400 is about 500 microns in diameter, the system 300 forms a "ribbon" having dimensions of roughly 2.5 mm×0.5 mm. It is also possible that the five filament layers 320-400 could be stacked into a 2×3 configuration, with two filaments on top and three on the bottom, creating a larger, approximately rectangular, "super" filament having dimensions of about 1.5 mm×1 mm. The strand 300, which may be viewed as a "super filament", may then be printed into larger lattices and 3D shapes as is typical of DIW manufactured structures.

As described in the "Materials" section above, five different inks are used in the strand 300 shown in FIG. 6. Again, these are: an insulating ink; a conductive ink; a resistive ink; a shape memory polymer ink; and an inductive ink. Each filament layer 320-400 in this example is printed with up to three distinct inks, from the five available inks. As will be appreciated, this will involve the need to incorporate some switching capability for applying up to three different inks from the same printing nozzle of a DIW system. With such capability, only two nozzles would be required, one that can print resistive, inductive and insulating inks in succession, and one that can print conductive, shape memory polymer and insulating inks in succession. Otherwise, with only a single printing nozzle, the different materials could be printed in successive filaments. In this case, each filament may be printed separately at a different time, so long as they are adjacent and make contact. For example, each individual filament could be printed with three nozzles, each with a single ink, but this would require the ability to start and stop ink flow with regularity. Finally, the filaments strand 300 could be printed successively, one ink and one nozzle at a time.

Potential Applications

A number of potential applications of the teachings provided herein should be evident. For example:

1) One possible application is printing lines and shapes that can each change into a number of 3D configurations after printing. For example, a line may be printed that folds into a ring or a cube. Having one material that can take many shapes reduces the number of preconstructed shapes that have to be stored in confined spaces, such as on a submarine, a space station, a backpack, etc. For example, often many tools are needed to perform one job or task, with each one of a different shape for a single purpose. A programmable or "smart" strand can take many shapes to suit many purposes or needs.

2) Another application is changing the mechanical properties of a lattice through actuation, thereby changing the support structures/shapes. Also, the designer may wish to add inks which are structurally rigid once cured, as an additional line to the portions of a finished structure or part that do not bend/actuate.

3) Another application is printing on top of other 3D printed structures, like a hinged triangular array. The strand can then be used to actuate origami-like folding.

4) Another application entails adding a functional filament (e.g., a conductive filament not used in the signal control backbone, but printed in parallel). An example of this is shown in FIG. 7 with strand 300' having filament layers 320'-400', plus an additional filament layer 420'. The added filament layer 420' may have a specific functional quality, for example and without limitation, it may be conductive, or thermal sensing, or capacitive sensing, or inductive sensing, or temperature sensing, or even explosive. Through actuation, the functional line may transform into an antenna, a radar reflector, or even reconfigure electrical pathways through systematic folding to join or separate electrical contacts at select, various points along the printed structure.

5) Another application is having the strand 50 or 300 "self actuate" into a tower, perimeter or fence. This could be particularly useful in establishing fences/towers, for example in military applications where snipers may present a danger to humans. The fences could be configured to detect a breach or even be electrified using added functional filaments.

6) Another application is creating a large cumulative force from many smaller strands adding constructively, possibly snaking through a crack and reconfiguring within a small space to apply force from the inside. Also, it is possible that the strands 50 or 300 may be arranged similar to an accordion, so that a plurality of strands move in unison to apply tension, or possibly to provide a lifting function or a pressing function.

7) Still another application is having the smart strand interlock into a linked "chain mail" type material or self-weave. The mechanical properties of the resulting material can be tailored by the density and directionality of links or the weave. This provides the ability to provide a finished structure with adjustable, anisotropic mechanical properties.

Additional Complex Applications

8) Still further complex applications may involve the use of actuation to allow the strand to have mobility, for example, by moving in a "slithering" motion over a surface, to thus enable entry or passage through small spaces, between walls, in pipes, in caves. For example, a strand 500 shown in FIG. 8, may include distinct sections 520, 540, 560, 580 and 600, separated by actuator sections A1, A2, A3 and A4, will allow movement about four axes defined by the actuator sections A1-A4. The strand 500 may be used to form a structure that is able to flex sufficiently in tight spaces to be able to drag electrical wires through spaces, such as between walls, beams, etc. for wiring a building or inspecting interior areas of walls within a building, or even inspecting HVAC ductwork within a building.

9) Another possible application is adding a supercapacitor containing segment 700, as shown in FIG. 9. The supercapacitor segment 700 may be formed using sections of conductive ink 720 separated by sections of microporous carbon that is loaded with electrolyte 740, where the sections 740 are in turn separated by a printable porous polymer separator (e.g., polypropylene, polyethylene, polyvinylidene fluoride) 760. The microporous carbon and electrolyte might be encapsulated in a core-shell type printed filament. This gives individual strands 50 or 300 a separate power source. In this case they would no longer need to be tethered to one another.

10) Another application is including printable weaknesses or inclusions of chemicals that will ignite or deteriorate at specific junctions when triggered. As shown in FIG. 10, a long strand 800 can therefore be programmed to divide into a series of smaller strands 820a, 820b and 820c to achieve its purposes.

11) Still another application is enabling the strand 50 or 300 to climb/snake its way up a ladder, truss structure or chain linked fence, through actuation.

12) Still another application is adding a camera to the front of the strand 50 or 300 to see the progress of the strand 50 or 300 in tight places. One could also place a radio beacon on the head to allow for the triangulation of the front of the strand's location and better real time control.

13) Another application may involve allowing individual strands 50 or 300 with supercapacitor tails (for power) to be actuated by a radio signal. For example, one could drop innocuous strands across a road that fold up into shapes designed to create obstructions, or pop vehicle tires when activated.

14) Still another application may involve air dropping many pounds of smart strands to snake and do reconnaissance. Based on sensor detections (e.g. a printed thermocouple), the strand 300 or structure formed by a plurality of the strands 50 or 300 could fold into a specific pattern than is visibly readable from the air, or possibly by bouncing radio waves off of it.

15) Another application is allowing many individually powered (supercapacitor tail) strands to assemble into something larger.

16) Another application is adding an explosive functional line. For safety, the explosive line is less than the critical diameter of the explosive, and may only detonate if it receives a signal to fold on itself in a specific way that puts it above the critical diameter. One could also consider different explosive lines with different sensitivities that must fold in a complex way to fully detonate.

17) Another application is, in real time, giving a structure made from one or more strands 50 or 300 the ability to respond to a signal and to fold an explosive line into different lattices with differing densities, which will detonate in different ways. This may also include gradient densities.

18) Another application may involve snaking the explosive line under a door, through a keyhole, up pipes, etc. until it reaches a target room, then folds itself into a detonable shape and explodes.

19) Still another application may involve issuing a pack of smart strands 50 or 300 to soldiers, with accompanying software that soldiers can use on their phones to program simple tasks for the smart strand.

20) Still another application may involve deploying a strand 300 or structure made using a plurality of the strands 50 or 300 to wrap or encapsulate something dangerous, or possibly to plug a leak.

21) Still another application may involve using a structure made from one or more of the smart strands 50 or 300 to move explosives into or out of alignment in small devices for safety. This could require a complex sequence of actuations to move the parts into proper alignment.

22) Due to the scalable nature of the smart strands 50 or 300 described herein, one could print large scale objects. For example, one could print a chair that turns into a desk, or even the structural skeleton for a tent. This tent skeleton can be adjusted in size and architecture to suit differing needs, with a fabric then positioned to cover the skeleton.

It will be appreciated that a plurality of applications exist which may involve the response of non-motive inks. While many of the applications of this invention described thus far concern the ability to use chiplets and a printable signal control backbone to activate (or actuate) a conductive shape memory polymer, the signal control backbone may additionally be used to activate inks having other responsive properties such as color change, tunable chemistry, tunable density, tunable porosity, tunable electric charge state, tunable magnetic field state, or tunable sensing and diagnostics. As will be described, these other types of active inks may be triggered with chiplets or the signal control backbone, and may be used independently or in conjunction with one another.

In one application the signal control backbone may be used to manipulate an electrochromic or thermochromic ink, and change the color of the print at select points.

In another application the signal control backbone may be used to manipulate an ink laden with microcapsules. The shell of these microcapsules may be designed to melt or burst at a specified temperature. Through local resistive heating with the signal control backbone, the microcapsules may be induced to rupture locally, releasing their contents. Those contents may be chemicals that will react locally with the structure, or solvents that will evaporate away, leaving behind void spaces. Thus the signal control backbone 50 or 50' could be used to tune the chemistry, porosity or density of the printed structure at specific spatial locations.

In another application the signal control backbone 50 or 50' could be used to alter the charge state of a capacitive or supercapacitive ink segment. For instance a supercapacitive liquid could be embedded in microcapsules or in a core shell configuration within the filament.

In another application, the signal control backbone 50 or 50' could be used to alter the current through an inductive ink and thus the magnetic field at a specific spatial location in the print. Among other things, this local magnetic field could alter the mechanical properties of a collocated or nearby filament of ink bearing magnetorheological particles. Furthermore, the signal control backbone could be used to heat a magnetic ink above its curie temperature, to otherwise alter the magnetic field at specific locations.

In another application, the signal control backbone could be used to ignite reactive inks (such as thermite inks developed at LLNL) at specific spatial locations. These inks can be set off electrostatically and burn at high temperatures. These inks could be used for welding, separation of components, or to detonate explosives.

In another application inks may be laden with sensors that could be triggered and readout using the signal control backbone 50 or 50'. Simple sensors might look for conductivity, capacitance, inductance, or temperature of an object nearby or in contact with the print. These sensors may be internal to the filament (e.g. by incorporating inductive, or capacitive ink, or creating a printed thermocouple junction). The sensors could also be printed as a part of the 3D design space. More complex sensors might be printed on chiplet substrates and made to connect through a percolating fashion, or to incorporate MEMS devices.

In another application sensors (controlled with a signal control backbone) may feedback information that is used to activate responsive inks (also via a signal control backbone). For instance, embedded chiplet-based sensors may detect where someone is touching a print and enact a responsive color, chemistry or shape change, specific to the sensed action. In one example, the response may be to release a chemical to drive away the entity touching the print.

In another application, the printed signal control backbone may be connected to external sensors, devices, or computational systems. This would allow the print to receive and send signals to externally connected devices.

Further Alternate Designs and Applications

With inductors and resistors, bandpass filters may be printed (as parallel filaments) with a circuit design similar to that shown in FIG. 11. With multiple sequential bandpass filters, specific frequencies sent down the input line would be filtered for, each bandpass passing on only a specific frequency to an actuating resistor.

Additional Design Considerations to Avert Nozzle Clogging

One of the key difficulties in establishing a fully printable signal control network is that the electronic components cannot be specifically arranged or wired up as one might using a breadboard circuit. As the chiplets (with embedded responsive electronic components) are extruded (in their form mixed into the polymer ink), they come out with relatively random positions and orientations. This is why percolation theory is relied on as a means of connecting the chiplets. As noted above, percolation is a statistical network that does not rely on precision placement, but instead incorporates the randomness of the placement. However, in some cases the concentration (volume fraction) of the chiplets necessary for percolation may be higher than ideal. This could lead to situations where the ink is too thick to extrude, clogs at the nozzle, or the ink is expensive due to the number of chiplets required. Accordingly, an alternative means of connecting the chiplets (other than direct chiplet percolation) involves replacing parts of the network with smaller, percolating elements, such as carbon nanotubes. Carbon nanotubes are in general are much smaller than chiplets and have higher aspect ratios. They are also simpler and cheaper to produce. All of these factors alleviate the thickening of the ink, potential clogging at the nozzle and the price of producing chiplet-based inks. Several methods are disclosed to replace some of the chiplets with simpler or smaller percolating elements. Carbon nanotubes are a likely candidate, but other conductive carbons (e.g., carbon black, graphite, graphene) or conductive elements (nanowires or nanoparticles) may also be used.

There are a number of different ways that the carbon nanotubes or other substitute elements might be implemented. FIGS. 12-15 illustrate four different implementations. These may incorporate an interface between polar and nonpolar inks, but do not necessarily have to. In each case, chiplets are still involved, but in a lower concentration (volume fraction) than would otherwise be necessary. The chiplets are still the means of incorporating logic circuits for control. (Carbon nanotubes and other conductive elements are always conductive, not selectively conductive, and thus do not offer control). We must remind ourselves that it is important that the signal pass through at least 1 chiplet, thereby motivating the solutions provided below.

A first implementation may use two conductive inks, one which is polar and one which is nonpolar (or two immiscible inks), as shown in FIG. 12 Each ink is conductive due to percolation within the ink. For instance, both inks may have a percolating network of carbon nanotubes, but in one ink those nanotubes have had their surfaces functionalized to be hydrophilic while the nanotubes in the other ink were functionalized to be hydrophobic. If the inks are sufficiently viscous, surface functionalization may not be necessary. A low volume fraction of chiplets may also be incorporated into one or both of the inks. These inks are printed through the same nozzle one after the other. This will create a polar/nonpolar interface. These inks may also be mixed statically or dynamically as they are extruded. Both static and dynamic mixing techniques for mixing inks, as they are extruded from a direct ink write nozzle, have been previously developed by the assignee of the present disclosure.

The working principle is the presumption that the carbon nanotubes are too small to breach the polar/nonpolar interface. Thus the nanotubes alone cannot create a continuous conductive pathway. However, the chiplets are much larger than the nanotubes (micron scale) and are presumed to be large enough to breach the polar/nonpolar interface. This is due to both their length and inertia. Thus the only conductive pathway through the interface is through a chiplet. This enforces that the segment will not always be conductive but will be selectively conductive given the properties of the chiplet. This gives us signal control. This type of junction could be used in conjunction to the signal control system (e.g., voltage divider/selective current bridge/shape memory polymer (or other active ink)).

A second implementation scheme is shown in FIG. 13. It has been explained that the pressure gradient and shear forces associated with DIW printing can be used to both center and align carbon nanotubes within a filament. By controlling this, one may create an inner region of filaments that have a high density of fairly aligned carbon nanotubes, and a sparse outer region that does not have a percolating network of carbon nanotubes. Perpendicularly across, this filament is not conductive. However, by incorporating a low concentration of chiplets, one may by statistics, obtain some chiplets that perpendicularly intersect the carbon nanotube high density filament core and create a continuous connective path from one side of the filament to the other, through the chiplets.

A third implementation is shown in FIG. 14. With this implementation, some difficultly may be expected in getting parallel printed filaments to connect with each other electrically. Accordingly, one may use a gradient of carbon nanotubes to ensure a complete electrical connection across parallel filaments. By "on the fly" controlling which inks get extruded (with mixing control), gradients in a single filament may be established. For example, one may intersperse regions of high chiplet concentration with regions of high carbon nanotube concentrations. The presumption is that forming electrical contact between chiplets and nanotubes, and then between nanotubes and other nanotubes, is easier than forming electrical contact between chiplets perpendicularly across the filaments. This is because there are less chiplets in general and thus less points to form contact. In this implementation, the chiplet shape may be selected so as to promote alignment of the chiplet parallel to the filament. This would reduce the percolation threshold of the chiplets.

As a fourth implementation, it may be possible to span the entire filament perpendicularly with a single chiplet, as shown in FIG. 15. In this case the chiplet would be designed to be longer than the nozzle diameter (which is also the filament diameter). In the shear flows created by the nozzle, the chiplet may be induced to spin, once it leaves the nozzle, and thereby contact both sides of the filament. These may in turn make contact with a highly loaded and highly conductive carbon nanotube ink in adjacent filaments. This may require specific design of the chiplet shape and/or the nozzle shape.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A 3D printed signal control backbone apparatus, comprising:
    a filament including:
        a first material section bounded on opposing ends by second material sections;
        the first material section formed by an ink having a percolating network of a plurality of chiplets infused in a non-conductive polymer, the plurality of chiplets forming electrically responsive elements imparting a predetermined logic function and being responsive to a predetermined electrical signal; and
        the second material sections formed by an ink which is electrically conductive.

2. The apparatus of claim 1, wherein the plurality of chiplets comprises a plurality of chiplets that each perform a logic or signal function including at least one of:
    a diode;
    a Zener diode;
    a silicon controlled rectifier logic function;
    a transistor;
    a capacitor; and
    a resistor.

3. The apparatus of claim 1, further comprising a plurality of the first material sections, each said one of the first material sections being separated by a pair of ones of the second material sections, such that the first and second material sections forming an alternating sequence of sections over a length of the filament.

4. The apparatus of claim 1, further comprising a second filament printed parallel to and in contact with the filament over a length of the filament.

5. The apparatus of claim 4, wherein the second filament comprises a plurality of chiplet infused ink segments separated by electrically non-conductive ink segments, each one of the chiplet infused ink segments enabling a current flow therethrough only when a voltage drop across it reaches a predetermined level.

6. The apparatus of claim 5, wherein the first material sections each form a predetermined voltage drop across a length thereof, such that the filament forms a voltage divider network along its length.

7. The apparatus of claim 6, further comprising a third filament printed adjacent to and in contact with the second filament, the third filament having at least one material segment responsive to an electrical signal received through one of the chiplet infused ink segments.

8. The apparatus of claim 7, wherein the at least one material segment of the third filament comprises an electrically conductive shape memory polymer material segment.

9. The apparatus of claim 8, wherein the third filament comprises a plurality of the shape memory polymer material segments each separated by a pair of non-electrically conductive material segments over its length.

10. The apparatus of claim 9, wherein the third filament is formed with each one of the shape memory polymer material segments laterally aligned with, and in contact with, an associated one of the chiplet infused ink segments of the second filament.

11. The apparatus of claim 9, further comprising a fourth filament formed adjacent to and in contact with the third filament along a length of the third filament, the fourth filament being an electrically conducting filament over its full length.

12. The apparatus of claim 11, wherein the filament, the second filament, the third filament and the fourth filament are all co-extensive in length and parallel to one another, and cooperatively form the 3D printed signal control backbone apparatus.

13. The apparatus of claim 1, wherein the apparatus is able to provide at least one of:
    a tunable color;
    a tunable chemistry;
    a tunable porosity;
    a tunable density;
    tunable mechanical properties;
    a reactive material;
    an explosive material;
    a tunable charge state;
    tunable magnetic field;

a control feature to sense at least one of conductivity, capacitance, inductance, temperature, moisture, filament rupture, or filament bending; and a responsive MEMS sensor.

* * * * *